(12) United States Patent
Liu et al.

(10) Patent No.: US 7,795,680 B2
(45) Date of Patent: Sep. 14, 2010

(54) INTEGRATED CIRCUIT SYSTEM EMPLOYING SELECTIVE EPITAXIAL GROWTH TECHNOLOGY

(75) Inventors: Huang Liu, Singapore (SG); Alex K. H. See, Singapore (SG); James Lee, Singapore (SG); Johnny Widodo, Singapore (SG); Chung Woh Lai, Singapore (SG); Wenzhi Gao, Singapore (SG); Zhao Lun, Singapore (SG); Shailendra Mishra, Singapore (SG); Liang-Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 11/952,947

(22) Filed: Dec. 7, 2007

(65) Prior Publication Data
US 2009/0146262 A1    Jun. 11, 2009

(51) Int. Cl.
*H01L 29/04* (2006.01)

(52) U.S. Cl. .................. 257/348; 257/521; 257/627; 257/E29.003; 257/E29.018; 257/E29.261; 438/150; 438/269; 438/405

(58) Field of Classification Search .................. 257/348, 257/351, 507, 521, 523, E29.003, E20.004, 257/E29.004, E29.018, E29.261, 627; 438/149, 438/150, 156, 268, 269, 405
See application file for complete search history.

(56) References Cited

U.S. PATENT DOCUMENTS

| | | | |
|---|---|---|---|
| 5,087,586 A | | 2/1992 | Chan et al. |
| 6,013,547 A | * | 1/2000 | Liaw .................. 438/238 |
| 6,635,543 B2 | | 10/2003 | Furukawa et al. |
| 6,972,478 B1 | | 12/2005 | Waite et al. |
| 7,067,387 B2 | | 6/2006 | Lin |
| 7,393,730 B2 | * | 7/2008 | Hsu et al. .................. 438/150 |
| 2007/0122634 A1 | | 5/2007 | Lee et al. |

* cited by examiner

*Primary Examiner*—Davienne Monbleau
*Assistant Examiner*—Shweta Mulcare
(74) *Attorney, Agent, or Firm*—Mikio Ishimaru (57) ABSTRACT

An integrated circuit system that includes: providing a substrate; depositing a dielectric on the substrate; depositing an isolation dielectric on the dielectric; forming a trench through the isolation dielectric and the dielectric to expose the substrate; depositing a dielectric liner over the integrated circuit system; processing the dielectric liner to form a trench spacer; and depositing an epitaxial growth within the trench that includes a crystalline orientation that is substantially identical to the substrate.

20 Claims, 6 Drawing Sheets

INTEGRATED CIRCUIT SYSTEM EMPLOYING SELECTIVE EPITAXIAL GROWTH TECHNOLOGY

TECHNICAL FIELD

The present invention relates generally to integrated circuits, and more particularly to an integrated circuit system employing selective epitaxial growth technology.

BACKGROUND ART

Integrated circuits find application in many of today's consumer electronics, such as cell phones, video cameras, portable music players, printers, computers, etc. Integrated circuits may include a combination of active devices, passive devices and their interconnections.

As the technology node within integrated circuit systems continues to shrink, it is becoming increasingly more difficult to isolate these structures from one another. A common isolation technology employed within semiconductor manufacturing is the formation of a shallow trench isolation (STI) between adjacent active regions. Typically, STI structures are formed by etching a shallow trench between adjacent active regions and then depositing a dielectric film within the trench. Unfortunately, current STI manufacturing techniques, such as trench lithography printing, trench etching and trench gap fill, are nearing their process limitations for sub 65 nanometer devices.

Additionally, as other semiconductor manufacturing techniques near their process limitations for sub 65 nanometer manufacturing, it is becoming increasingly important to optimize current device design. For example, substrate orientation within an integrated circuit can be manipulated to optimize carrier mobility within a channel by utilizing a <110> channel orientation for a p-channel transistor and a <100> channel orientation for an n-channel transistor. Unfortunately, most semiconductor manufacturing techniques use a single orientation substrate that cannot be optimized to take advantage of the effect that different substrate orientations can have on different devices.

Thus, a need still remains for a reliable integrated circuit system and method of fabrication, wherein the integrated circuit system can be electrically isolated and optimized for device performance. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a substrate; depositing a dielectric on the substrate; depositing an isolation dielectric on the dielectric; forming a trench through the isolation dielectric and the dielectric to expose the substrate; depositing a dielectric liner over the integrated circuit system; processing the dielectric liner to form a trench spacer; and depositing an epitaxial growth within the trench that includes a crystalline orientation that is substantially identical to the substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact between elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The term "system" as used herein means and refers to the method and to the apparatus of the present invention in accordance with the context in which the term is used.

The terms "first", "second", "third" and "fourth" as used herein are for purposes of differentiation between elements only and are not to be construed as limiting the scope of the present invention.

The term "isolation dielectric" as used herein includes any material that electrically isolates an epitaxial region formed within the isolation dielectric.

Generally, the following embodiment relates to the formation of an epitaxial region that is electrically isolated. It has been discovered by the present inventors that trench patterning for selective epitaxial growth permits the formation of smaller isolation structures (e.g.—sub 65 nanometer isolation structures) between adjacent regions.

FIGS. 1-8, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 1-8. Moreover, it is to be understood that many modifications, additions, and/or omissions may be made to the below described process without departing from the scope or spirit of the claimed subject matter. For example, the below described process may include more, fewer, or other steps.

Additionally, it is to be appreciated that the integrated circuit system of the present disclosure may include any number of multi-electrode devices in which the current flowing between two specified electrodes is controlled or modulated by the voltage applied at a control electrode. Exemplary illustrations may include an n-channel field effect transistor (nFET), a p-channel field effect transistor (pFET), a complementary metal-oxide-silicon (CMOS) configuration, a single-gate transistor, a multi-gate transistor, a fin-FET, or an annular gate transistor. Furthermore, it is to be understood that one or more of the integrated circuit system could be prepared at one time on a medium, which could be separated into individual or multiple integrated circuit assemblies at a later stage of fabrication.

Figure 1:
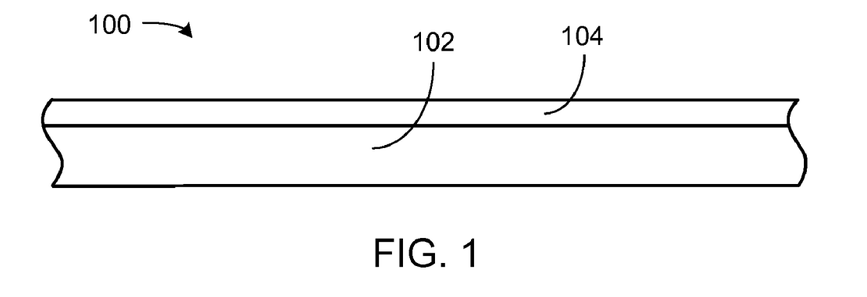
FIG. 1 is a cross-sectional view of an integrated circuit system in an initial stage of manufacture in accordance with an embodiment of the present invention.

Referring now to FIG. 1, therein is shown a cross-sectional view of an integrated circuit system 100 in an initial stage of manufacture in accordance with an embodiment of the present invention. The integrated circuit system 100 includes a substrate 102. By way of example, the substrate 102 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 102 may also include doped and undoped configurations, strained configurations, and one or more crystal orientations (e.g.—<100>, <110>, and/or <111> orientations), which may be strategically employed to optimize carrier mobility within nFET and pFET devices. By way of example, the substrate 102 can be impurity doped either N-type or P-type, but is preferably doped P-type with a resistivity of about five (5) ohm-cm to about one hundred (100) ohm-cm.

In an aspect of the present embodiment, the substrate 102 may possess a thickness ranging from about one hundred (100) nanometers to about several hundred microns, for example.

However, the examples provided for the substrate 102 are not to be construed as limiting and the composition of the substrate 102 may include any material, configuration, or thickness that physically and electrically enables the formation of active and/or passive device structures.

A dielectric 104 can be formed over/on the substrate 102. The dielectric 104 can be formed by wet or dry process techniques and may include an oxygen containing material such as, but not limited to, silicon dioxide and/or silicon oxynitride. However, it is to be understood that the type of material chosen for the dielectric 104 is not limited to the above examples and may include any material that protects the substrate 102 during subsequent processing steps.

By way of example, the dielectric 104 may range in thickness from about ten (10) angstroms to about two hundred (200) angstroms. However, the thickness of the dielectric 104 is not to be limited to the preceding example, and may include any thickness that protects the substrate 102 during subsequent processing steps.

It is to be understood that the integrated circuit system 100 may undergo a cleaning step to remove surface contaminants, such as particles, mobile ionic contaminants, organics and native oxides, before the formation of the dielectric 104.

Figure 2:
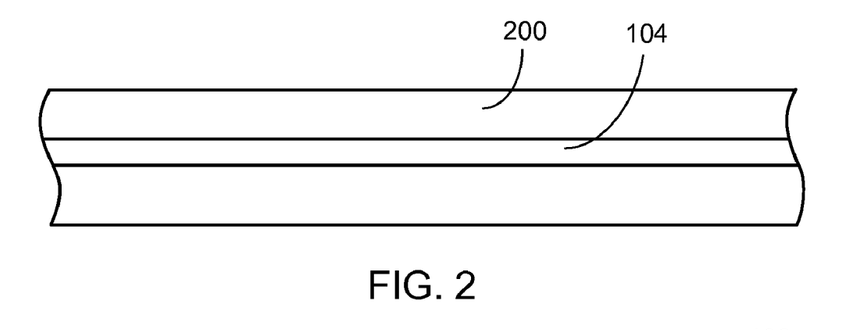
FIG. 2 is the structure of FIG. 1 after formation of an isolation dielectric.

Referring now to FIG. 2, therein is shown the structure of FIG. 1 after formation of an isolation dielectric 200. The isolation dielectric 200 can be formed over/on the dielectric 104. The isolation dielectric 200 can also be formed by wet or dry process techniques and may include an oxygen containing material such as, but not limited to, silicon dioxide and/or silicon oxynitride. However, it is to be understood that the type of material chosen for the isolation dielectric 200 is not limited to the above examples and may include any material that permits adequate device isolation for a subsequently formed structure, such as an epitaxial growth 700, of FIG. 7. The present inventors have discovered that by optimizing the thickness and the type of material chosen for the isolation dielectric 200 that the electrical interference between adjacent structures formed within the isolation dielectric can be reduced, even for sub 65 nanometer isolation structures.

Generally, the isolation dielectric 200 may range in thickness from an order of angstroms to an order of microns. More specifically, in a preferred aspect of the embodiment, the isolation dielectric 200 may range in thickness from about five hundred (500) angstroms to about one thousand (1,000) nanometers. However, the thickness of the isolation dielectric 200 is not to be limited to the preceding example, and may include any thickness that permits adequate device isolation for a subsequently formed structure within the isolation dielectric 200.

Figure 3:
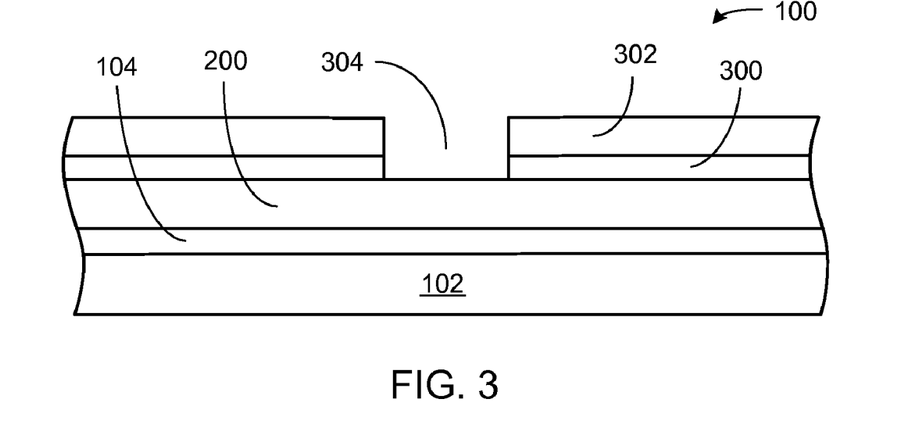
FIG. 3 is the structure of FIG. 2 after forming a first mask and a second mask.

Referring now to FIG. 3, therein is shown the structure of FIG. 2 after forming a first mask 300 and a second mask 302. The first mask 300 and the second mask 302 can be strategically patterned to form an opening 304 that defines a region where a trench 400 (described in FIG. 4) is to be formed within the isolation dielectric 200 and the dielectric 104.

By way of example, the first mask 300 may include an organic or an inorganic dielectric material that can be used to suppress unintended energy reflection (e.g.—a bottom anti-reflective coating) from the substrate 102 and the second mask 302 may include an energy sensitive film such as a negative tone resist, a positive tone resist, or a chemically amplified resist, for example. However, the preceding examples are not to be construed as limiting, and the first mask 300 and the second mask 302 may include any combination of anti-reflective coatings and photoresist material that can form the opening 304 within the first mask 300 and the second mask 302.

Although the present embodiment depicts the first mask 300 and the second mask 302 with only one of the opening 304, it is to be understood that the first mask 300 and the second mask 302 may include more than one of the opening 304. Accordingly, the present embodiment may include any number (i.e.—one or more) of the opening 304 within the first mask 300 and the second mask 302 as required by the design specifications of the integrated circuit system 100.

It is to be understood that the first mask 300 is optional and the formation of the opening 304 could be achieved by only using the second mask 302. Moreover, it is to be understood that additional layers, such as a primer and/or a top anti-reflective coating may be employed to enhance the development of the second mask 302.

Figure 4:
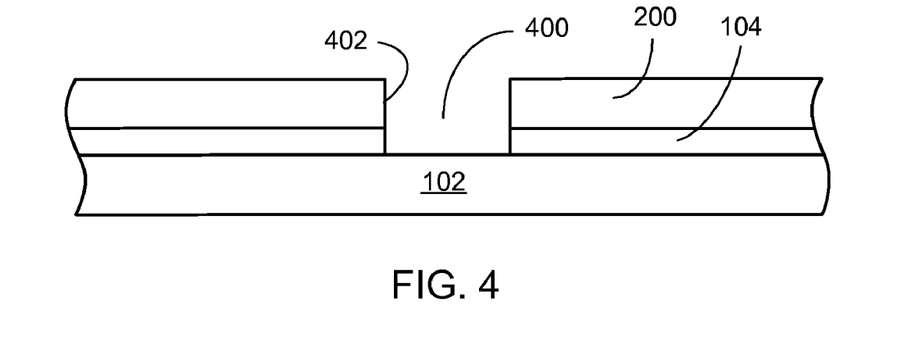
FIG. 4 is the structure of FIG. 3 after forming a trench.

Referring now to FIG. 4, therein is shown the structure of FIG. 3 after forming the trench 400. The trench 400 can be formed by removing selective portions of the isolation dielectric 200 and the dielectric 104 by a single step etch process or a multiple step etch process that is selective to the material chosen for each of the isolation dielectric 200 and the dielectric 104. By way of example, the selected portions of the isolation dielectric 200 and the dielectric 104 can be removed by a patterned anisotropic dry etch process, such as reactive ion etching, that terminates upon reaching the substrate 102. In at least one embodiment, the trench 400 can be described as being formed only within the isolation dielectric 200 and the dielectric 104. It is to be understood that the etch profile of a trench sidewall 402 can be either an anisotropic vertical etch profile or an anisotropic taper etch profile.

Inasmuch as electronic devices will be subsequently formed within or over the trench 400, the area of the trench 400 depends upon the number of such devices that will be formed in the trench 400. Since the number of such electronic devices could be as few as one or as many as thousands or more, each of the length and the width of the trench 400 could generally be as small as an order of angstroms or as large as hundreds of microns. In a preferred aspect of the embodiment, the length and the width can each range from about 300 angstroms to about several microns. However, the examples previously provided for the length and the width are not to be construed as limiting and the area of the trench 400 is currently only limited by the technology of the photolithography equipment employed.

Moreover, it is to be understood that if one or more of the trench 400 are formed in this process step that the remaining portions of the isolation dielectric 200 and the dielectric 104 between the trench 400 can be less than 65 nanometers. Due to the process techniques discovered by the present inventors, a sub 65 nanometer isolation structure (i.e.—the remaining portions of the isolation dielectric 200 and the dielectric 104 between the trench 400) can be had that still provides adequate electrical isolation between the structures to be formed within the trench 400.

Furthermore, it is to be understood that the shape of the trench 400 may include any rectilinear or curvilinear shape and is not limited to a circular, rectangular or square-like shape.

After forming the trench 400 the first mask 300 (of FIG. 3) and the second mask 302 (of FIG. 3) can be removed by processes well known within the art and not repeated herein.

Figure 5:
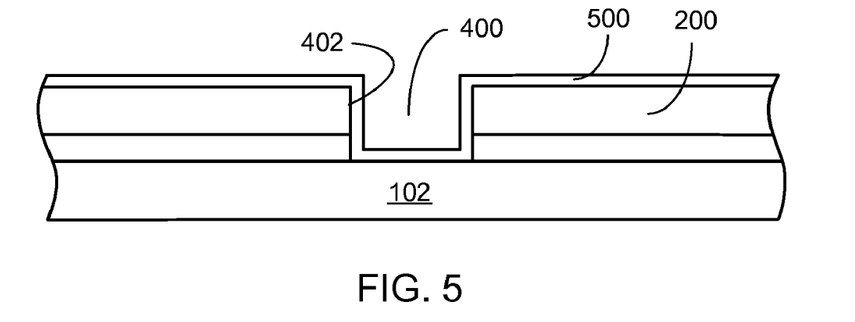
FIG. 5 is the structure of FIG. 4 after forming a dielectric liner.

Referring now to FIG. 5, therein is shown the structure of FIG. 4 after forming a dielectric liner 500. The dielectric liner 500 is deposited over/on the isolation dielectric 200, the trench sidewall 402 and the exposed portions of the substrate 102. The dielectric liner 500 may include insulation type materials that help isolate and/or enable a subsequent single crystalline epitaxial growth within the trench 400. In an aspect of the present embodiment, the dielectric liner 500 may include silicon nitride, silicon oxide and/or silicon oxynitride type materials deposited to a thickness of about ten (10) angstroms to about five hundred angstroms. However, it is to be understood that the present embodiment can be practiced without the formation of the dielectric liner 500, if desired.

Figure 6:
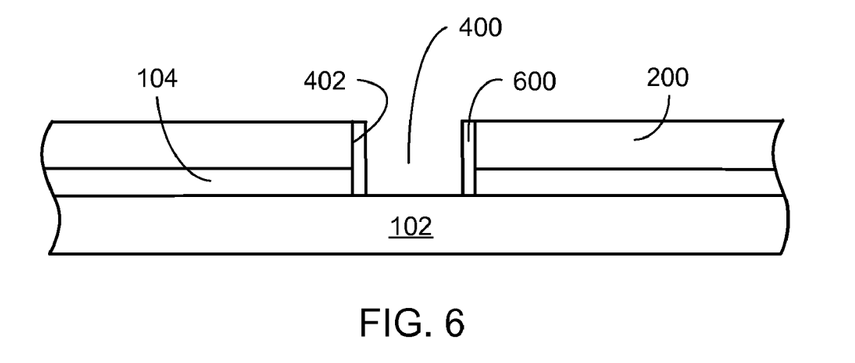
FIG. 6 is the structure of FIG. 5 after processing the dielectric liner to remove selected portions.

Referring now to FIG. 6, therein is shown the structure of FIG. 5 after processing the dielectric liner 500, of FIG. 5, to remove selected portions. The selective etch of the dielectric liner 500 removes the dielectric liner 500 from the horizontal surfaces of the integrated circuit system 100, thereby exposing the isolation dielectric 200 and the portion of the substrate 102 within the trench 400. The remaining portions of the dielectric liner 500 form a trench spacer 600 on the trench sidewall 402. It is to be understood that the trench spacer 600 can help provide additional insulative effects for a subsequently deposited epitaxial layer with a single crystalline orientation from the substrate 102.

By way of example, the dielectric liner 500 can be selectively etched by an anisotropic process, such as reactive ion etching.

It will be appreciated by those skilled in the art that a clean step can be performed to remove surface contaminants, such as particles, mobile ionic contaminants, organics and native oxides from the exposed surfaces of the isolation dielectric 200, the dielectric 104 and the substrate 102 after processing the dielectric liner 500.

Figure 7:
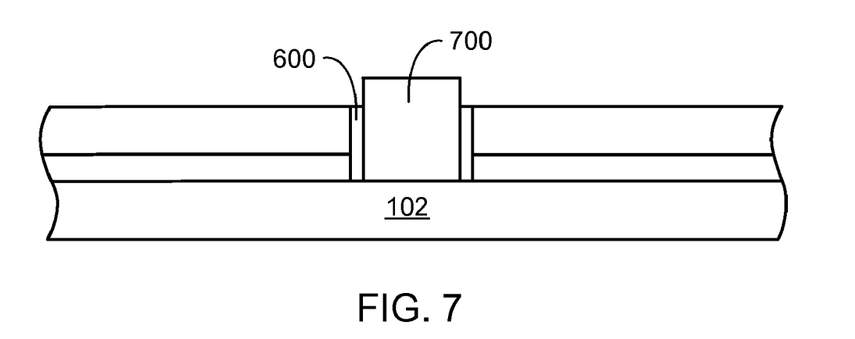
FIG. 7 is the structure of FIG. 6 after formation of an epitaxial growth.

Referring now to FIG. 7, therein is shown the structure of FIG. 6 after formation of the epitaxial growth 700. By way of example, the epitaxial growth 700 can be deposited within the trench 400, of FIG. 6, by a selective epitaxial process employing silane ($SiH_4$) or dichlorosilane ($SiH_2Cl_2$) with an etchant gas, such as hydrogen chloride (HCl), which helps to prevent formation of the epitaxial growth 700 along the trench spacer 600. By employing a selective epitaxial process for depositing the epitaxial growth 700, the epitaxial growth 700 can obtain a crystalline structure that is substantially identical to the crystalline orientation of the substrate 102 (e.g.—a <100>, <110>, or <111> orientation). In a preferred aspect of the invention the epitaxial growth 700 includes silicon but it is to be understood that the epitaxial growth 700 may also include other semiconducting materials that match the composition of the substrate 102.

As exemplary illustrations, the substrate 102 could possess a <110> crystalline orientation or the substrate 102 could possess a <100> crystalline orientation. Accordingly, the epitaxial growth 700 that forms upon the substrate 102 could have a <110> crystalline orientation that could be used to optimize pFET device performance or the epitaxial growth 700 could have a <100> crystalline orientation that could be used to optimize nFET device performance.

Figure 8:
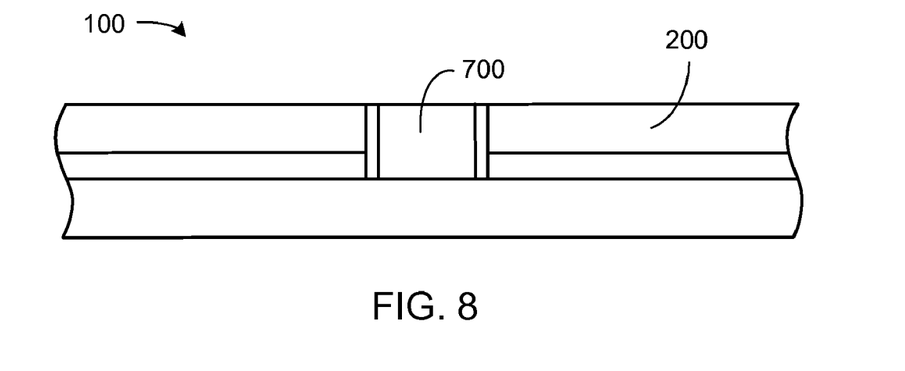
FIG. 8 is the structure of FIG. 7 after planarizing an integrated circuit system.

Referring now to FIG. 8, therein is shown the structure of FIG. 7 after planarizing the integrated circuit system 100. In order to ensure appropriate fill of the trench 400, of FIG. 6, some overfill of the epitaxial growth 700 may occur above the surface of the isolation dielectric 200. Accordingly, a local or global chemical mechanical polishing process, for example, can be employed to planarize the integrated circuit system 100, as needed.

It will be appreciated by those skilled in the art that after planarizing the integrated circuit system 100 that the region defined by the epitaxial growth 700 is now ready for fabrication of electronic devices, which can be strategically designed and formed to implement the desired function of the integrated circuit system 100. By way of example, the electronic devices formed within the integrated circuit system 100 may include active components, passive components, processor components, memory components, logic components, digital components, analog components, power components, and so forth, in numerous configurations and arrangements as may be needed.

Generally, the following embodiment relates to the formation of discrete epitaxial regions with different crystalline orientations optimized for device carrier mobility, while electrically isolating these epitaxial regions with sub 65 nanometer isolation structures.

FIGS. 9-20, which follow, depict by way of example and not by limitation, an exemplary process flow for the formation of the integrated circuit system in accordance with another embodiment and they are not to be construed as limiting. It is to be understood that a plurality of conventional processes that are well known within the art and not repeated herein, may precede or follow FIGS. 9-20. Moreover, it is to be understood that many modifications, additions, and/or omissions may be made to the below described process without departing from the scope or spirit of the claimed subject matter. For example, the below described process may include more, fewer, or other steps.

Additionally, it is to be appreciated that the integrated circuit system of the present disclosure may include any number of multi-electrode devices in which the current flowing between two specified electrodes is controlled or modulated by the voltage applied at a control electrode. Exemplary illustrations may include an n-channel field effect transistor (nFET), a p-channel field effect transistor (pFET), a complementary metal-oxide-silicon (CMOS) configuration, a single-gate transistor, a multi-gate transistor, a fin-FET, or an annular gate transistor. Furthermore, it is to be understood that one or more of the integrated circuit system could be prepared at one time on a medium, which could be separated into individual or multiple integrated circuit assemblies at a later stage of fabrication.

Figure 9:
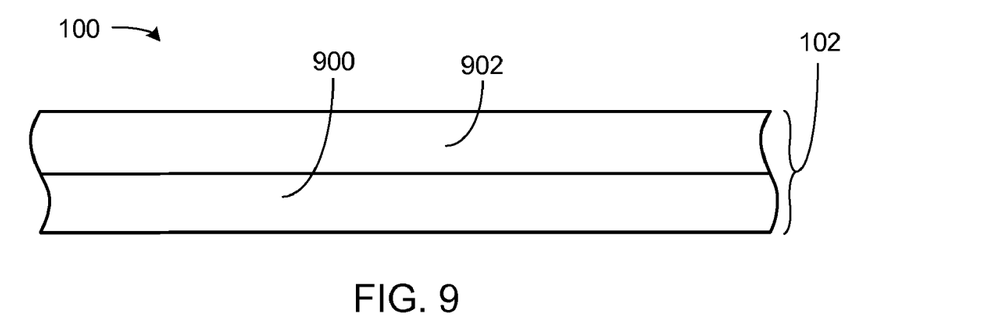
FIG. 9 is a cross-sectional view of an integrated circuit system in an initial stage of manufacture in accordance with another embodiment of the present invention.

Referring now to FIG. 9, therein is shown a cross-sectional view of the integrated circuit system 100 in an initial stage of manufacture in accordance with another embodiment of the present invention. The integrated circuit system 100 includes the substrate 102 with a first layer 900 and a second layer 902.

By way of example, the first layer 900 can be bonded to the second layer 902 by diffusion bonding at high temperature; however, it is to be understood that the first layer 900 can be bonded to the second layer 902 by other wafer bonding techniques well known within the art. Furthermore, it is to be understood that each of the first layer 900 and the second layer 902 may undergo a cleaning step to remove surface contaminants, such as particles, mobile ionic contaminants, organics and native oxides, before bonding.

Although the present embodiment only depicts the substrate 102 including the first layer 900 and the second layer 902, it is to be understood that the substrate 102 may include any number of layers, wherein the number of layers is only limited by the integration need of the integrated circuit system 100. As an exemplary illustration, the substrate 102 may include a third layer and a fourth layer in addition to the first layer 900 and the second layer 902, wherein each of the layers may possess crystalline orientations that are different, similar, or a combination thereof.

By way of example, the first layer 900 and the second layer 902 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the first layer 900 and the second layer 902 may also include doped and undoped configurations, strained configurations, and one or more crystal orientations (e.g.—<100>, <110>, and/or <111> orientations), which may be strategically employed to optimize carrier mobility within nFET and pFET devices. By way of example, the first layer 900 and the second layer 902 can be impurity doped either N-type or P-type, but are preferably doped P-type with a resistivity of about five (5) ohm-cm to about one hundred (100) ohm-cm.

Notably, the first layer 900 and the second layer 902 of the present embodiment can possess different crystalline orientations. For example, the first layer 900 may include a <100> orientation and the second layer 902 may include a <110> orientation, or vice versa. However, it is to be understood that the substrate 102 may include any number of layers, wherein at least one of the layers possesses a different crystalline orientation than that of the other layers.

The thickness of the first layer 900 and the second layer 902 can be of equal or unequal thickness. By way of example, the thickness of each of the first layer 900 and the second layer 902 can range from about one hundred (100) nanometers to about several hundred microns.

It is to be understood that the examples provided above for the substrate 102 are not to be construed as limiting and the substrate 102 may include any material, crystalline orientation, or thickness that physically and electrically enables the formation of active and/or passive device structures.

Figure 10:
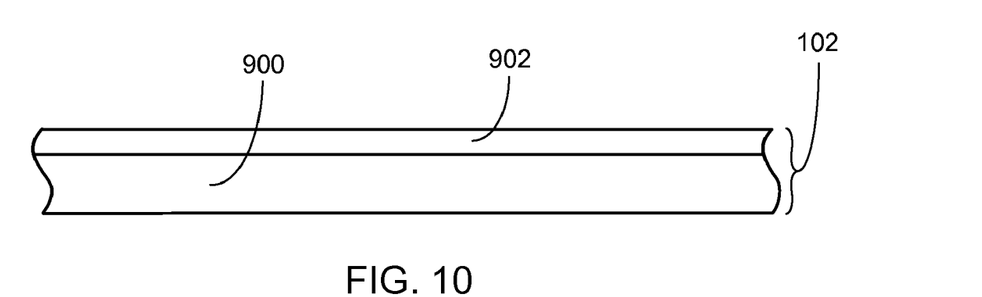
FIG. 10 is the structure of FIG. 9 after thinning a substrate.

Referring now to FIG. 10, therein is shown the structure of FIG. 9 after thinning the substrate 102. Per this embodiment, the second layer 902 can be thinned to a thickness of about ten (10) nanometers to about one hundred (100) nanometers by wafer cutting techniques well known within the art. However, it is to be understood that the thickness of the second layer 902 is not limited to the preceding examples and may include any thickness that optimizes the performance of the integrated circuit system 100. Additionally, it is to be understood that the first layer 900 could also be thinned, either in addition to or instead of the second layer 902. In an aspect of the present embodiment, the second layer 902 and/or the first layer 900 are thinned by chemical mechanical polishing techniques, for example.

Figure 11:
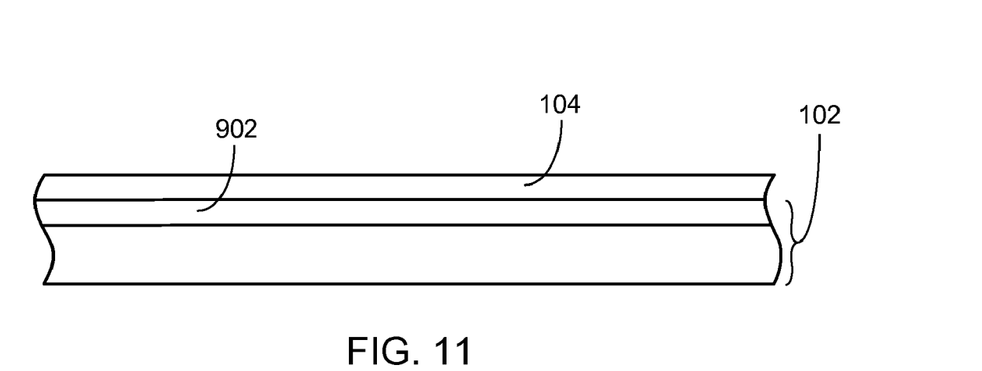
FIG. 11 is the structure of FIG. 10 after formation of a dielectric.

Referring now to FIG. 11, therein is shown the structure of FIG. 10 after formation of the dielectric 104. The dielectric 104 can be formed over/on the substrate 102. The dielectric 104 can be formed by wet or dry process techniques and may include an oxygen containing material such as, but not limited to, silicon dioxide and/or silicon oxynitride. However, it is to be understood that the type of material chosen for the dielectric 104 is not limited to the above examples and may include any material that protects the substrate 102 during subsequent processing steps.

By way of example, the dielectric 104 may range in thickness from about ten (10) angstroms to about two hundred (200) angstroms. However, the thickness of the dielectric 104 is not to be limited to the preceding example, and may include any thickness that protects the substrate 102 during subsequent processing steps.

It is to be understood that the exposed surface of the second layer 902 may undergo a cleaning step to remove surface contaminants, such as particles, mobile ionic contaminants, organics and native oxides, before the formation of the dielectric 104.

Figure 12:
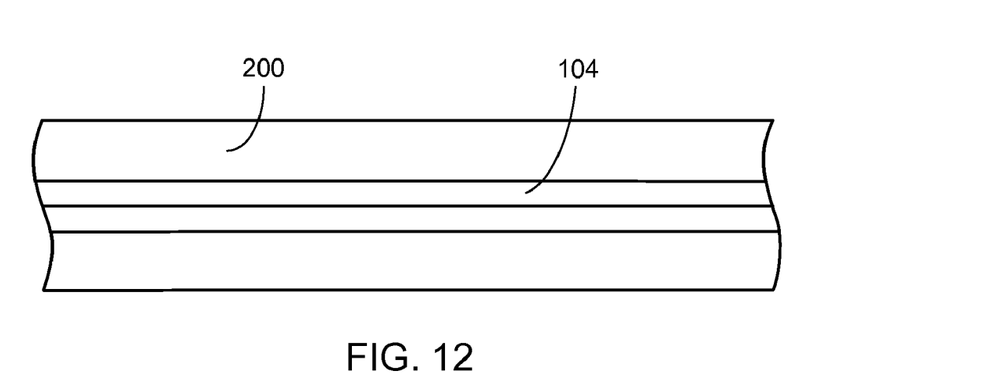
FIG. 12 is the structure of FIG. 11 after formation of an isolation dielectric.

Referring now to FIG. 12, therein is shown the structure of FIG. 11 after formation of the isolation dielectric 200. The isolation dielectric 200 can be formed over/on the dielectric 104. The isolation dielectric 200 can also be formed by wet or dry process techniques and may include an oxygen containing material such as, but not limited to, silicon dioxide and/or silicon oxynitride. However, it is to be understood that the type of material chosen for the isolation dielectric 200 is not limited to the above examples and may include any material that permits adequate device isolation between subsequently formed structures, such as the epitaxial growth 700, of FIG. 19.

Generally, the isolation dielectric 200 may range in thickness from an order of angstroms to an order of microns. More specifically, in a preferred aspect of the embodiment, the isolation dielectric 200 may range in thickness from about five hundred (500) angstroms to about one thousand (1,000) nanometers. However, the thickness of the isolation dielectric 200 is not to be limited to the preceding example, and may include any thickness that permits adequate device isolation for subsequently formed structures within the isolation dielectric 200.

Figure 13:
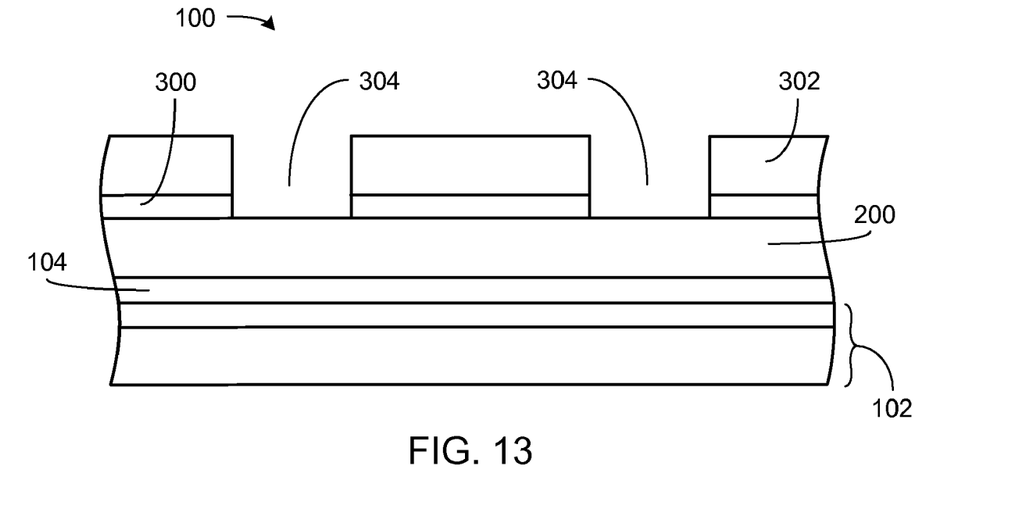
FIG. 13 is the structure of FIG. 12 after forming a first mask and a second mask.

Referring now to FIG. 13, therein is shown the structure of FIG. 12 after forming the first mask 300 and the second mask 302. The first mask 300 and the second mask 302 can be strategically patterned to form the opening 304 that defines a region where the trench 400 (described in FIG. 14) is to be formed within the isolation dielectric 200 and the dielectric 104.

By way of example, the first mask 300 may include an organic or an inorganic dielectric material that can be used to suppress unintended energy reflection (e.g.—a bottom anti-reflective coating) from the substrate 102 and the second mask 302 may include an energy sensitive film such as a negative tone resist, a positive tone resist, or a chemically amplified resist, for example. However, the preceding examples are not to be construed as limiting, and the first mask 300 and the second mask 302 may include any combination of anti-reflective coatings and photoresist material that can form the opening 304 within the first mask 300 and the second mask 302.

Although the present embodiment depicts the first mask 300 and the second mask 302 with two of the opening 304, it is to be understood that the first mask 300 and the second mask 302 may include one or more of the opening 304. Accordingly, the present embodiment may include any number (i.e.—one or more) of the opening 304 within the first mask 300 and the second mask 302 as required by the design specifications of the integrated circuit system 100. For example, if the substrate 102 contained three layers, each with a different crystalline orientation, the integrated circuit system 100 may possess three of the opening 304.

It is to be understood that the first mask 300 is optional and the formation of the opening 304 could be achieved by only using the second mask 302. Moreover, it is to be understood that additional layers, such as a primer and/or a top anti-reflective coating may be employed to enhance the development of the second mask 302.

Figure 14:
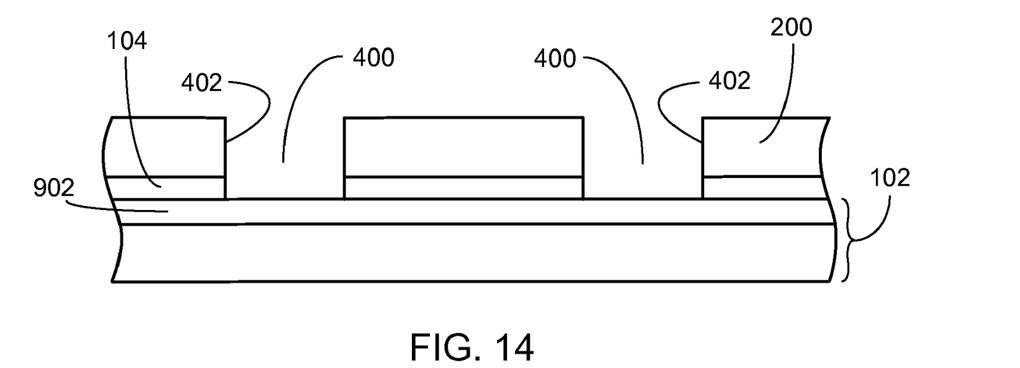
FIG. 14 is the structure of FIG. 13 after forming a trench.

Referring now to FIG. 14, therein is shown the structure of FIG. 13 after forming the trench 400. The trench 400 can be formed by removing selective portions of the isolation dielectric 200 and the dielectric 104 by a single step etch process or a multiple step etch process that is selective to the material chosen for each of the isolation dielectric 200 and the dielectric 104. By way of example, the selected portions of the isolation dielectric 200 and the dielectric 104 can be removed by a patterned anisotropic dry etch process, such as reactive ion etching, that terminates upon reaching the second layer 902 of the substrate 102. It is to be understood that the etch profile of the trench sidewall 402 can be either an anisotropic vertical etch profile or an anisotropic taper etch profile.

Inasmuch as electronic devices will be subsequently formed within or over the trench 400, the area of the trench 400 depends upon the number of such devices that will be formed in the trench 400. Since the number of such electronic devices could be as few as one or as many as thousands or more, each of the length and the width of the trench 400 could generally be as small as an order of angstroms or as large as hundreds of microns. In a preferred aspect of the embodiment, the length and the width can each range from about 300 angstroms to about several microns. However, the examples previously provided for the length and the width are not to be construed as limiting and the area of the trench 400 is currently only limited by the technology of the photolithography equipment employed.

Moreover, it is to be understood that the remaining portions of the isolation dielectric 200 and the dielectric 104 between the trench 400 can be less than 65 nanometers. Due to the process techniques discovered by the present inventors, a sub 65 nanometer isolation structure (i.e.—the remaining portions of the isolation dielectric 200 and the dielectric 104 between the trench 400) can be had that still provides adequate electrical isolation between the structures to be formed within the trench 400.

Furthermore, it is to be understood that the shape of the trench 400 may include any rectilinear or curvilinear shape and is not limited to a circular, rectangular or square-like shape.

After forming the trench 400 the first mask 300 (of FIG. 13) and the second mask 302 (of FIG. 13) can be removed by processes well known within the art and not repeated herein.

Figure 15:
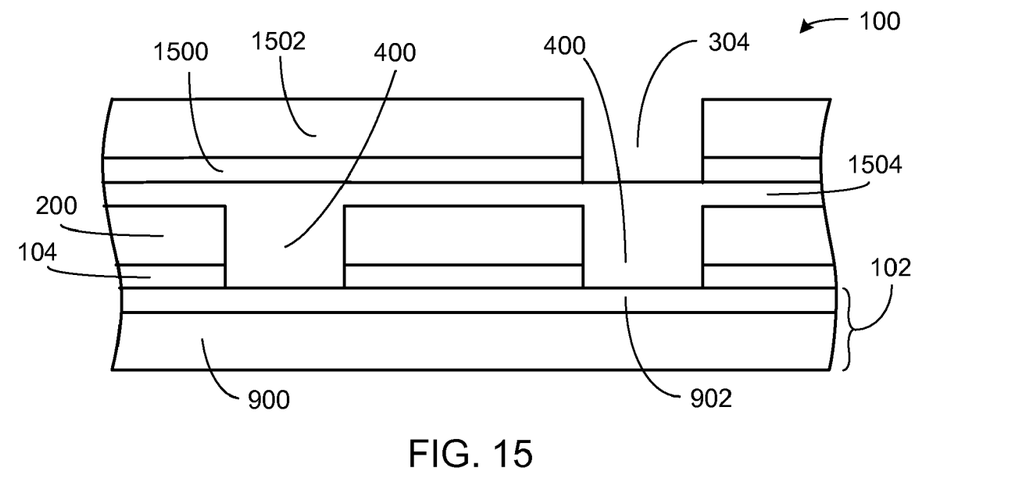
FIG. 15 is the structure of FIG. 14 after forming a third mask and a fourth mask.

Referring now to FIG. 15, therein is shown the structure of FIG. 14 after forming a third mask 1500 and a fourth mask 1502. Initially, a support layer 1504 is deposited over the integrated circuit system 100, including within the trench 400. The support layer 1504 provides a medium over which the third mask 1500 and the fourth mask 1502 can be formed. By way of example, the support layer 1504 may include a single layer of spin-on coated organic material for better planarization or it may include multiple layers, such as a spin-on coated organic material on the bottom and a dielectric material on the top.

As an exemplary illustration, the third mask 1500 may include an organic or an inorganic dielectric material that can be used to suppress unintended energy reflection (e.g.—a bottom anti-reflective coating) from the support layer 1504 and the substrate 102 and the fourth mask 1502 may include an energy sensitive film such as a negative tone resist, a positive tone resist, or a chemically amplified resist, for example. However, the preceding examples are not to be construed as limiting, and the third mask 1500 and the fourth mask 1502 may include any combination of anti-reflective coatings and photoresist material that can form the opening 304 within the third mask 1500 and the fourth mask 1502.

Notably, the third mask 1500 and the fourth mask 1502 can be strategically patterned to form the opening 304 over either of the trench 400. It is to be understood that the third mask 1500 and the fourth mask 1502 may include one or more of the opening 304, and the number of the opening 304 can depend upon, for example, the number of layers within the substrate 102 with different crystalline orientations. The opening 304 within the third mask 1500 and the fourth mask 1502 defines a region where the trench 400 (described in FIG. 16) is to be formed through the isolation dielectric 200, the dielectric 104, the second layer 902 and within the first layer 900.

It is to be understood that the third mask 1500 is optional and the formation of the opening 304 could be achieved by only using the fourth mask 1502. Moreover, it is to be understood that additional layers, such as a primer and/or a top anti-reflective coating may be employed to enhance the development of the fourth mask 1502.

Figure 16:
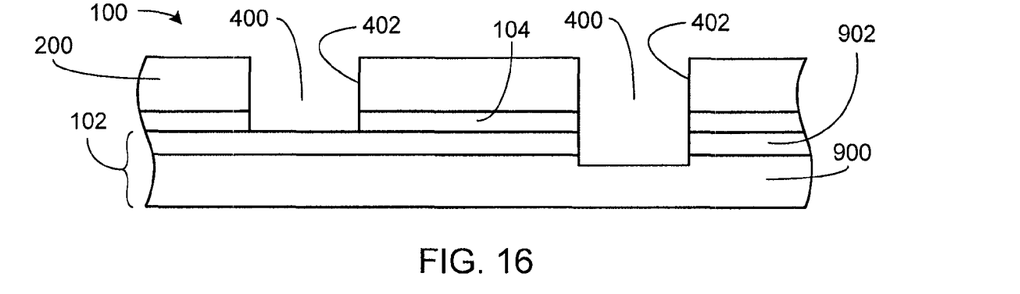
FIG. 16 is the structure of FIG. 15 after etching.

Referring now to FIG. 16, therein is shown the structure of FIG. 15 after etching. Per this embodiment, at least one of the trench 400 is subject to an additional selective etch to extend the bottom of the trench 400 to the first layer 900. The trench 400 can either be extended to the first layer 900 or within the first layer 900. As such, in at least one embodiment, at least one of the trench 400 can be described as being formed only within the isolation dielectric 200, the dielectric 104, and the second layer 902. By way of example, portions of the second layer 902 and/or the first layer 900 can be removed by a patterned anisotropic dry etch process, such as reactive ion etching, that is selective to the material chosen for the second layer 902 and/or the first layer 900. It is to be understood that the etch profile of the trench sidewall 402 can be either an anisotropic vertical etch profile or an anisotropic taper etch profile.

Although the present embodiment depicts only one of the trench 400 subject to an additional etch process, it is to be understood that the number of the trench 400 subject to the additional etch process can depend upon the desired function of the integrated circuit system 100 (e.g.—the number of layers within the substrate 102 with a different crystalline orientation).

After performing the additional selective etch to the trench 400, the third mask 1500 (of FIG. 15), the fourth mask 1502 (of FIG. 15) and the support layer 1504 (of FIG. 15) can be removed by processes well known within the art and not repeated herein.

Figure 17:
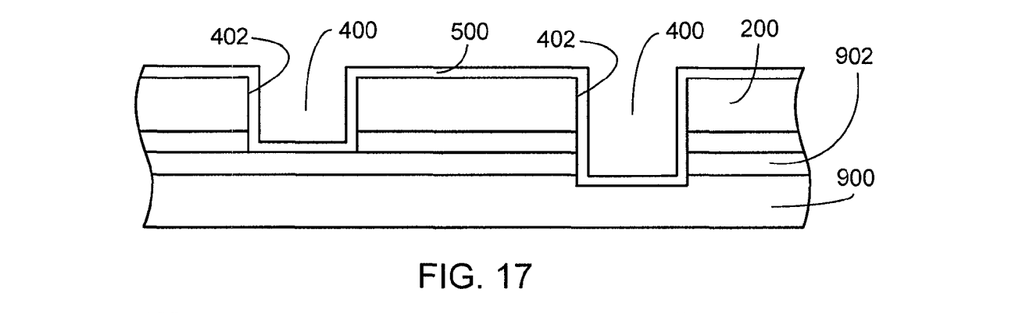
FIG. 17 is the structure of FIG. 16 after forming a dielectric liner.

Referring now to FIG. 17, therein is shown the structure of FIG. 16 after forming the dielectric liner 500. The dielectric liner 500 can be deposited over/on the isolation dielectric 200, the trench sidewall 402, the exposed portion of the second layer 902, and the exposed portion of the first layer 900. The dielectric liner 500 may include insulation type materials that help isolate and/or enable a subsequent epitaxial growth within each of the trench 400. In an aspect of the present embodiment, the dielectric liner 500 may include silicon nitride, silicon oxide and/or silicon oxynitride type materials deposited to a thickness of about ten (10) angstroms to about five hundred angstroms. However, it is to be understood that the present embodiment can be practiced without the formation of the dielectric liner 500, if desired.

Figure 18:
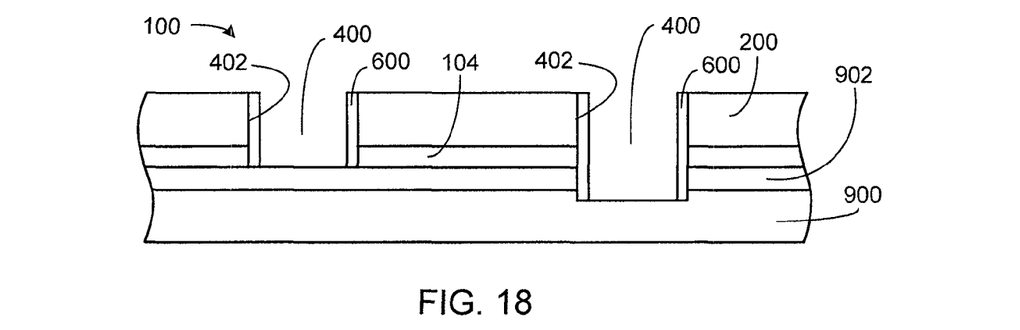
FIG. 18 is the structure of FIG. 17 after processing a dielectric liner to remove selected portions.

Referring now to FIG. 18, therein is shown the structure of FIG. 17 after processing the dielectric liner 500, of FIG. 17, to remove selected portions. The selective etch of the dielectric liner 500 removes the dielectric liner 500 from the horizontal surfaces of the integrated circuit system 100, thereby exposing the isolation dielectric 200 and the second layer 902 within one of the trench 400, and the isolation dielectric 200 and the first layer 900 within another of the trench 400. The remaining portions of the dielectric liner 500 form the trench spacer 600 on the trench sidewall 402 covering the isolation dielectric 200 and the dielectric 104 in one of the trench 400 and covering the isolation dielectric 200, the dielectric 104, the second layer 902 and the trench sidewall 402 of the first layer 900 in another of the trench 400. It is to be understood that the trench spacer 600 can help provide additional insulative effects for a subsequently deposited epitaxial layer with a single crystalline orientation from each of the second layer 902 and the first layer 900.

By way of example, the dielectric liner 500 can be selectively etched by an anisotropic process, such as reactive ion etching.

It will be appreciated by those skilled in the art that a clean step can be performed to remove surface contaminants, such as particles, mobile ionic contaminants, organics and native oxides from the exposed surfaces of the isolation dielectric 200, the dielectric 104, the second layer 902 and the first layer 900 after processing the dielectric liner 500.

Figure 19:
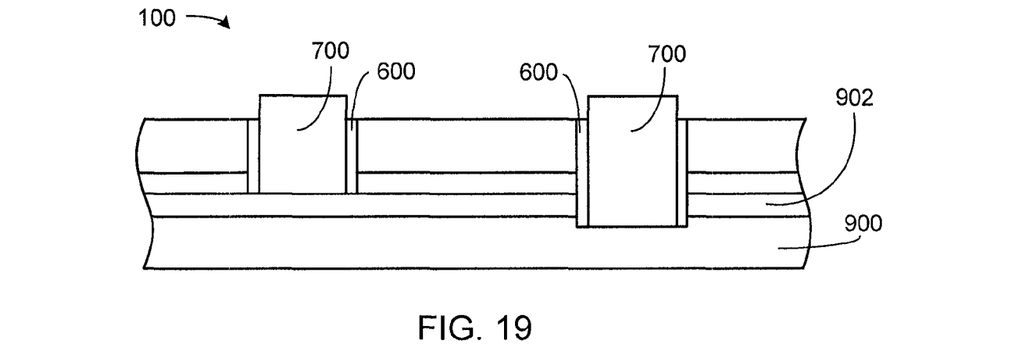
FIG. 19 is the structure of FIG. 18 after formation of an epitaxial growth.

Referring now to FIG. 19, therein is shown the structure of FIG. 18 after formation of the epitaxial growth 700. By way of example, the epitaxial growth 700 can be deposited within each of the trench 400, of FIG. 18, by a selective epitaxial process employing silane ($SiH_4$) or dichlorosilane ($SiH_2Cl_2$) with an etchant gas, such as hydrogen chloride (HCl), which helps to prevent formation of the epitaxial growth 700 along the trench spacer 600. By employing a selective epitaxial process for depositing the epitaxial growth 700, the epitaxial growth 700 can obtain a crystalline structure that is substantially identical to the crystalline orientation of the second layer 902 and/or the first layer 900 (e.g.—a <100>, <110>, or <111> orientation). In a preferred aspect of the invention the epitaxial growth 700 includes silicon but it is to be understood that the epitaxial growth 700 may also include other semiconducting materials that match the composition of the second layer 902 and the first layer 900.

As an exemplary illustration, the second layer 902 could possess a <110> crystalline orientation and the first layer 900 could possess a <100> crystalline orientation. Accordingly, the epitaxial growth 700 that forms upon the second layer 902 would have a <110> crystalline orientation that could be used to optimize pFET device performance and the epitaxial growth 700 that forms upon the first layer 900 would have a <100> crystalline orientation that could be used to optimize nFET device performance. It is to be understood that the crystalline orientations of the second layer 902 and the first layer 900 could be reversed and/or that additional crystalline orientations could be employed as required by the integration need of the integrated circuit system 100.

Figure 20:
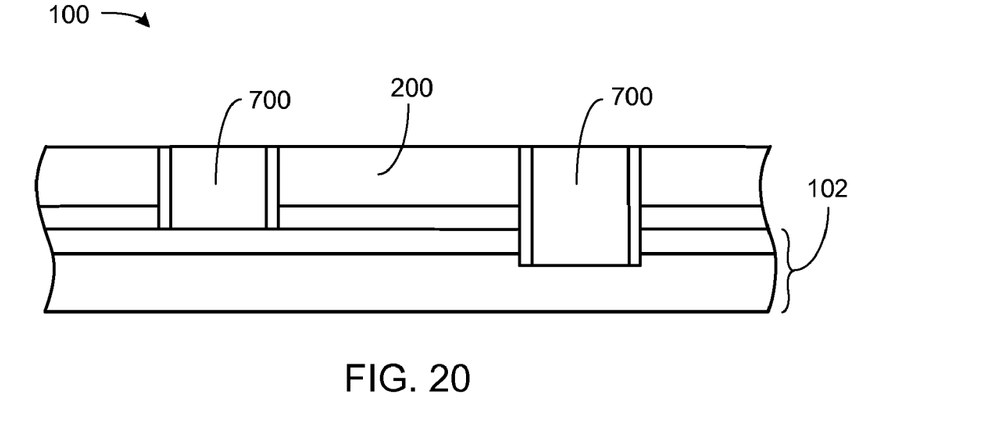
FIG. 20 is the structure of FIG. 19 after planarizing an integrated circuit system.

Referring now to FIG. 20, therein is shown the structure of FIG. 19 after planarizing the integrated circuit system 100. In order to ensure appropriate fill for each of the trench 400, of FIG. 18, some overfill of the epitaxial growth 700 may occur above the surface of the isolation dielectric 200. Accordingly, a local or global chemical mechanical polishing process, for example, can be employed to planarize the integrated circuit system 100, as needed.

It will be appreciated by those skilled in the art that after planarizing the integrated circuit system 100 that the region defined by the epitaxial growth 700 is now ready for fabrication of electronic devices, which can be strategically designed and formed to implement the desired function of the integrated circuit system 100. By way of example, the electronic devices formed within the integrated circuit system 100 may include active components, passive components, processor components, memory components, logic components, digital components, analog components, power components, and so forth, in numerous configurations and arrangements as may be needed.

Accordingly, the present embodiment can allow for the formation of a variety of electronically optimized devices within one of the substrate 102.

Figure 21:
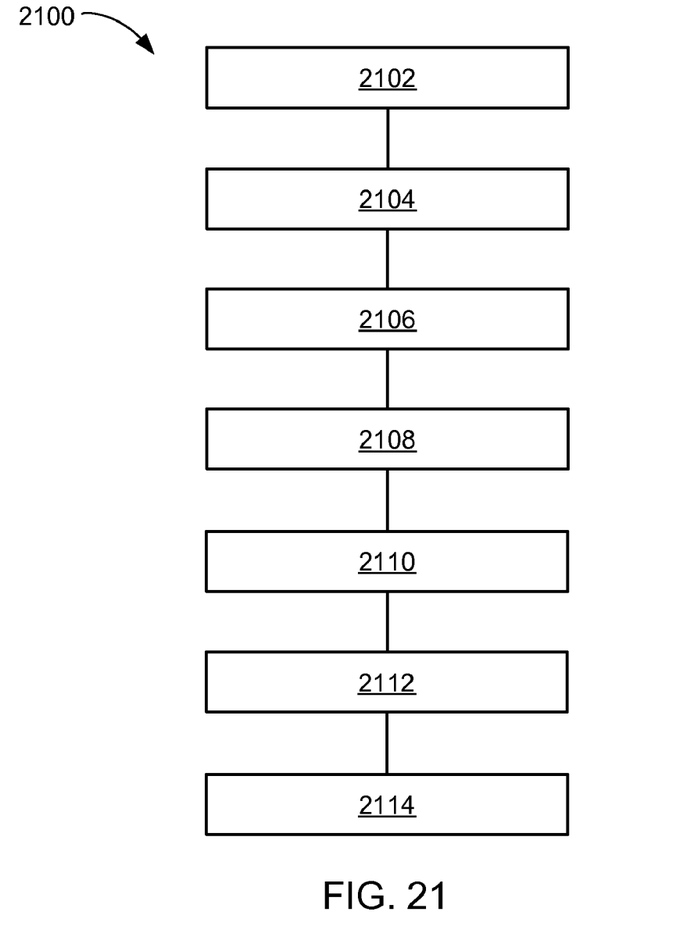
FIG. 21 is a flow chart of an integrated circuit system for an integrated circuit system, in accordance with an embodiment of the present invention.

Referring now to FIG. 21, therein is shown a flow chart of an integrated circuit system 2100 for the integrated circuit system 100, in accordance with an embodiment of the present invention. The integrated circuit system 2100 includes providing a substrate in a block 2102; depositing a dielectric on the substrate in a block 2104; depositing an isolation dielectric on the dielectric in a block 2106; forming a trench through the isolation dielectric and the dielectric to expose the substrate in a block 2108; depositing a dielectric liner over the integrated circuit system in a block 2110; processing the dielectric liner to form a trench spacer in a block 2112; and depositing an epitaxial growth within the trench that includes a crystalline orientation that is substantially identical to the substrate in a block 2114.

It has been discovered that the present invention thus has numerous aspects. One such aspect is that sub 65 nanometer electrical isolation regions can be formed without utilizing current STI manufacturing techniques, such as trench lithography printing, trench etching and trench gap fill, which are nearing their technology limitations for sub 65 nanometer designs.

Another aspect of the present invention is that it enables electrical isolation of epitaxial regions by employing sub 65 nanometer isolation structures via a simple manufacturing method.

Another aspect of the present invention is that it permits the selective formation of one or more epitaxial regions with one or more crystalline orientations that can be utilized to enhance nFET and pFET device performance.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for forming selective epitaxial regions. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
    providing a substrate;
    depositing a dielectric directly on the substrate;
    depositing an isolation dielectric directly on the dielectric;
    forming a trench only through the isolation dielectric and the dielectric to expose the substrate;
    depositing a dielectric liner over the integrated circuit system;
    processing the dielectric liner to form a trench spacer; and
    depositing an epitaxial growth within the trench that includes a crystalline orientation that is substantially identical to the substrate.

2. The method as claimed in claim 1 wherein:
    providing the substrate includes providing the substrate with a <100>, <110> or <111> crystalline orientation.

3. The method as claimed in claim 1 wherein:
    forming the trench includes employing a bottom anti-reflective coating.

4. The method as claimed in claim 1 wherein:
    processing the dielectric liner includes exposing the substrate within the trench.

5. The method as claimed in claim 1 wherein:
    depositing an epitaxial growth includes depositing silicon.

6. A method of manufacture of an integrated circuit system comprising:
    providing a substrate including a first layer and a second layer;
    depositing a dielectric directly on the substrate;
    depositing an isolation dielectric directly on the dielectric;
    forming a trench only through the isolation dielectric and the dielectric to expose the second layer;
    forming another trench only through the isolation dielectric, the dielectric, and the second layer to expose the first layer;
    depositing a dielectric liner over the integrated circuit system;
    processing the dielectric liner to form a trench spacer within each of the trenches;
    depositing an epitaxial growth within one of the trenches with a crystalline orientation that is substantially identical to the first layer; and
    depositing an epitaxial growth within another of the trenches with a crystalline orientation that is substantially identical to the second layer.

7. The method as claimed in claim 6 wherein:
    providing the substrate including the first layer and the second layer includes providing the first layer and the second layer with different crystalline orientations.

8. The method as claimed in claim 6 wherein:
    depositing the epitaxial growth within one of the trenches with a crystalline orientation that is substantially identical to the first layer includes depositing the epitaxial growth with a <100> or <110> crystalline orientation.

9. The method as claimed in claim 6 wherein:
    depositing the epitaxial growth within another of the trenches with a crystalline orientation that is substantially identical to the second layer includes depositing the epitaxial growth with a <100> or <110> crystalline orientation.

10. The method as claimed in claim 6 wherein:
forming one of the trenches to expose the second layer and forming another of the trenches to expose the first layer includes two separate masking steps.

11. An integrated circuit system comprising:
a substrate;
a dielectric directly on the substrate;
an isolation dielectric directly on the dielectric;
a trench only within the isolation dielectric and the dielectric that exposes the substrate;
a trench spacer within the trench; and
an epitaxial growth within the trench that includes a crystalline orientation that is substantially identical to the substrate.

12. The system as claimed in claim 11 wherein:
the substrate includes a <100>, <110> or <111> crystalline orientation.

13. The system as claimed in claim 11 wherein:
the dielectric and isolation dielectric include silicon dioxide.

14. The system as claimed in claim 11 wherein:
the trench spacer includes silicon nitride.

15. The system as claimed in claim 11 wherein:
the epitaxial growth includes silicon.

16. The system as claimed in claim 11 wherein:
the substrate includes a first layer and a second layer each with a different crystalline orientation.

17. The system as claimed in claim 11 wherein:
the trenches within the isolation dielectric and the dielectric includes one of the trenches exposing a second layer of the substrate and another of the trenches exposing a first layer of the substrate.

18. The system as claimed in claim 17 wherein:
the epitaxial growth within one of the trenches includes a crystalline orientation that is substantially identical to the second layer and the epitaxial growth within another of the trenches includes a crystalline orientation that is substantially identical to the first layer.

19. The system as claimed in claim 18 wherein:
the first layer and the second layer include different crystalline orientations.

20. The system as claimed in claim 11 wherein:
the epitaxial growth is optimized for an nFET device or a pFET device.

* * * * *